(12) United States Patent
Shvartsman

(10) Patent No.: US 7,755,414 B2
(45) Date of Patent: Jul. 13, 2010

(54) VERY LOW POWER CONSUMPTION SOLID STATE RELAY

(76) Inventor: Vladimir Shvartsman, 7331 Intermodal Dr., Louisville, KY (US) 40258

(*) Notice: Subject to any disclaimer, the term of this patent is extended or adjusted under 35 U.S.C. 154(b) by 10 days.

(21) Appl. No.: 12/150,440

(22) Filed: Apr. 28, 2008

(65) Prior Publication Data

US 2009/0108910 A1    Apr. 30, 2009

Related U.S. Application Data

(60) Provisional application No. 61/000,932, filed on Oct. 30, 2007.

(51) Int. Cl.
*H03K 17/687* (2006.01)
(52) U.S. Cl. .................... 327/427; 361/154; 361/160
(58) Field of Classification Search ............... 327/427; 361/154–156, 160
See application file for complete search history.

(56) References Cited

U.S. PATENT DOCUMENTS

2007/0216469 A1* 9/2007 Sakamoto .................. 327/519

* cited by examiner

*Primary Examiner*—Lincoln Donovan
*Assistant Examiner*—Shikha Goyal
(74) *Attorney, Agent, or Firm*—Clifford Kraft

(57) ABSTRACT

A normally closed solid state power relay with an optionally optically coupled input circuit at an input terminal with a driver circuit electrically coupled to input terminal to drive one or more a power transistors, preferably MOSFET transistors so that the power transistor is held in the on state by the driver when no voltage or a low level voltage is applied to the input terminal, and the power transistor is held in the off state by the driver when a high level voltage is applied to the input terminal. An energy storage device, a battery or capacitor, is coupled to the driver to powers the driver with the energy storage device being charged by energy from the input terminal when said input terminal when a high level voltage is applied to the input terminal. The energy storage device is charged by leakage current through a diode or through a resistor from the input circuit when the input circuit is in a high state.

8 Claims, 3 Drawing Sheets

VERY LOW POWER CONSUMPTION SOLID STATE RELAY

This application is related to and claims priority from U.S. Provisional Patent Application No. 61/000,932 filed Oct. 30, 2007. Application 61/000,932 is hereby incorporated by reference.

BACKGROUND

1. Field of the Invention

The present invention relates to solid state relays and more particularly to a solid state relay with very low power consumption.

2. Description of the Prior Art

For years, electromechanical relays have been used in a wide variety of power control electrical applications. Though these mechanical devices, which are built of a coil and contacts, have demonstrated considerable reliability, they suffer from the problems associated with having moving parts. A mechanical relay is subject to arcing and sparking, and in applications where it is required to switch a high DC voltage, the cost of a mechanical relay grows very rapidly. The coil switching leads to voltage spikes or fly-back voltage. In high power relays, as much as ten watts may be required to control the coil. Material fatigue can shorten the life of mechanical relays, and reliability can suffer due to shock and vibration.

These types of mechanical issues can be of major concern when relays are used in harsh environments. For example, many vehicles such as cars, tractor/trailers, heavy equipment and aircraft have a wide variety of relays in their various systems. These relays are subject to constant vibration from operation of the vehicle. Furthermore, many of the relays are built with contacts exposed to environmental conditions that might prove corrosive and lead to their failure (liquids, gases and other forms).

Since semiconductor devices have become widely available, and their cost has decreased, they have started to replace electromechanical relays. Previously in applications where a high power relay was required, normally closed terminals were required, and this substitution was unavailable. While it is possible to build a solid-state relay with normally closed terminals with comparable ratings (high current and low voltage) using a large number of depletion mode MOSFETs (D-MOSFET), the extremely high cost and large size of such a device makes it generally impractical. In the case of a high voltage, high current normally closed solid-state relay (SSR-NC), not D-MOSFET device existed in the prior art. It would be advantageous to have a solid-state relay that could be normally closed that solved these problems.

Solid-state and mechanical relays typically require substantial input power (control signal) for controlling and maintaining ON or OFF states of the output terminals. This power consumption is magnified in the case of an electromechanical relay. In come cases 10-20 watts is needed to move the terminals with the required speed. This makes regular (non-latchable) relays unusable in portable, low power applications.

An electromechanical lockable relay partially overcomes the problem with high power consumption since it is controlled with a short pulse, but it is bulkier, expensive to make, and more important, it has an inherent weakness—that of a flip-flop. It settles randomly at power-up into either of the two available states. Special extra circuitry must be used to insure it always settles into the desired initial state. It would also be advantageous to have a solid-state relay that solved these problems.

SUMMARY OF THE INVENTION

The present invention uses field effect devices and electronic circuitry as opposed to contacts, coils and downstream circuit breakers of conventional electromechanical relays. Unlike an electromechanical relay, the solid-state relay of the present invention is free of problems that arise from having mechanical parts which include arching and sparking. There are no contact materials to wear out or generate noise. Because of the use of electronic circuitry, the solid-state relay has a faster switching speed, and there are no switching voltage spikes from turning on a coil. Without moving parts that are subject to material fatigue, this solid-state relay has a longer operating life and is overall more reliable. Furthermore, by using semiconductor devices, the solid-state relay is resistant to shock and vibration. If potted in highly thermal conductive epoxy resin, the solid-state relay/breaker of the present invention can work in any environment including in a corrosive fluid.

The solid-state relay of the present invention may have normally closed contacts and has full isolation between the input and output terminals. The present invention is extremely valuable in high-side and low-side switching applications. The present invention remedies the problems associated with the high cost of making an SSR-NC relay based on a D-MOSFET. The extremely low power consumption of the present invention is extremely valuable where low power consumption is a priority. The same design can be used to build both normally open (SSR-NO) and normally closed (SSR-NC) relays.

The relay of the present invention can be configured to be used with conventional packaging systems known in the art. Specifically, the device can be housed in a box having a conventional footprint such as a housing having single in-line pins for easy printed circuit board assembly. A relay can be build from the design of the present invention for controlling any voltage and current level by selecting an output device (MOSFET or IGBT) correctly.

Depending on the selected internal energy storage device and discharge capacitor, a large variety of solid state relays with low power consumption can be designed. The storage device can be a large value capacitor, a low-leakage battery or a rechargeable battery. A large capacitor similar to a memory back-up capacitor can be used if the conductivity of the output terminals needs to be maintained for tens of hours or more; a rechargeable battery (depending on its capacitance) would be a good choice for providing an activated contact for months, and a coin type, low leakage battery can provide power to hold an activated contact for five or more years of continuous operation.

The present invention uses a charge holding device or a battery to hold an active contact for long periods of time (thus creating a normally closed relay). This corrects many of the problems associated with electromechanical relays such as a power hungry coil or slow moving mechanical parts. The transistors that replace these parts require much less power to operate and can be very fast. The present invention uses an electronic control circuit, a charge storage device and field-effect transistors.

DESCRIPTION OF THE FIGURES

Attention is drawn to several illustrations to better understand the principles and functioning of the present invention.

Several drawings and illustrations have been presented to aid in understanding the present invention. The scope of the present invention is not limited to what is shown in the figures.

DESCRIPTION OF THE INVENTION

Figure 1:
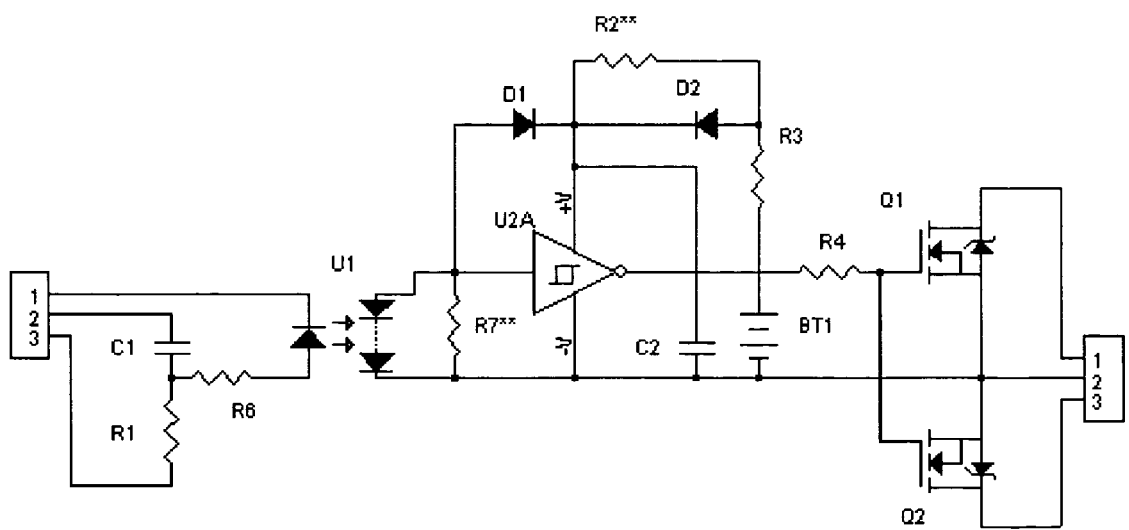
FIG. 1 shows a solid-state relay with normally-closed output terminals according to one embodiment of the invention. This embodiment uses a battery.
Figure 2:
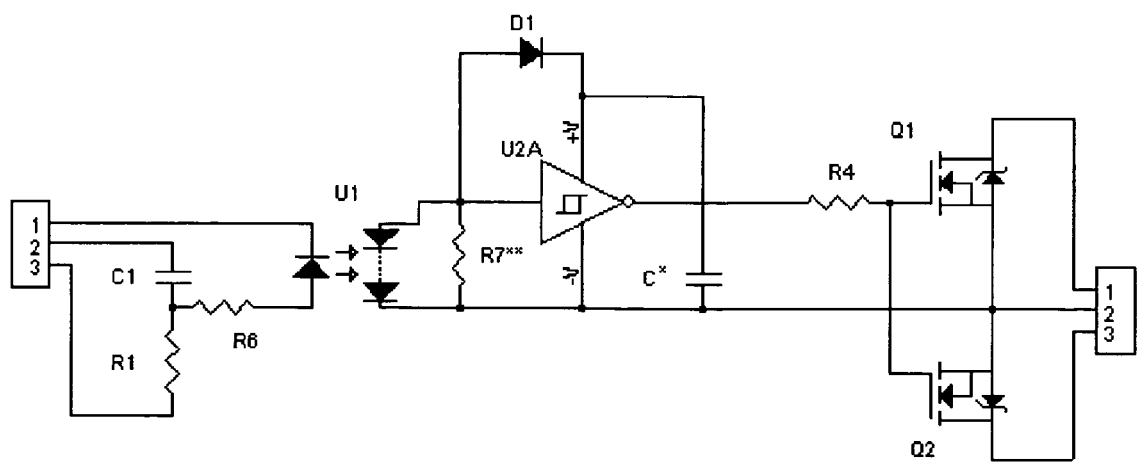
FIG. 2 shows a different embodiment of a normally-closed relay that uses a capacitor.

The present invention relates to a low power consumption solid-state relay device. Turning to FIG. 1, an embodiment of this relay system can be seen. The major switching devices are a pair of MOSFET transistors. These MOSFET devices can be replaced with other types of semiconductor switches like IGBT (bipolar devices) if desired. The two MOSFETS are connected to a driver circuit that controls the on and off states of the transistors. A single power MOSFET, bipolar or other transistor can also be used. In FIG. 1, the driver U2A monitors the voltage levels generated by an opto-isolated photovoltaic (U1). The photovoltaic cell U1 generates a voltage when an input signal is applied to its input terminals. The R-C1 network and resistor R6 provide the proper current flow into the input of U1. The photovoltaic device's output connects to the input of the driver U2A and the diode D1. The diode D1 conducts under control of the photovoltaic voltage into a discharge capacitor C2 and via diode D2 onto a storage device BT1. In FIG. 1, the storage device is a battery BT1. FIG. 2 shows a circuit identical to that of FIG. 1 except that the storage device is a capacitor C*. Different storage devices can be used including capacitors, batteries and rechargeable batteries. Any type of energy storage device is within the scope of the present invention. A capacitor is preferred for short-term storage (short term activated contacts), and a battery is preferred for longer-term storage as previously discussed.

In FIGS. 1-2, a resistor R4 is connected in series between the driver's output and the MOSFET gates. This resistor delivers a control voltage to the transistors' gates and limits current out of the driver. The resistor R3 controls discharging and charging currents of the gate capacitance (Cgd) of the MOSFET. An optional resistor R2 can control the charging current of the battery BT1. R2 is marked with asterisks in FIG. 1 to show that it can be changed to accommodate various charging rates. The three components D2, R2 and R3 are not required if BT1 is a rechargeable battery or a large capacitor (as in FIG. 2). An optional resistor R7 increases discharging speed after the input voltage is removed thus decreasing turn-off delay.

The pair of field-effect transistors (N-channel MOSFETS) are connected together at their gates a the driver (U2)'s output. Various combinations of paired transistors with different parameters such as drain-source voltage, current, on-state resistance, etc. can be chosen in the present invention to allow the design of a variety of devices capable of handling varying voltages and power.

FIG. 1 illustrates an embodiment of the present invention that works as follows: The output has two stable conditions, conducting or not conducting. The conducting state corresponds to the relay being closed; the not-conducting state corresponds to the relay being open. The normal state is the state with no input voltage applied. For a normally closed relay (NC), the output should be in a conducting state with no input voltage. This allows a low resistance conducting path for load current through the power transistors. The other or working state of the relay is when input voltage is applied. The device in that condition is open and does not provide a path for load current. When there is no input voltage, the photovoltaic device U1 generates no voltage, and the output of the inverter/driver U2A stays high. This high level is applied through resistor R4 to the gates of the MOSFETS which causes them to conduct from drain to source because of the field created in the drain-source channel. The capacitor C2 and the battery BT1 via resistor R3 provide power to the inverter/driver. In this condition, with any input signal absent, the discharge current from the battery is extremely small.

When an input signal is applied to the photovoltaic device U1, it generates a voltage which drives the inverter/driver U2A's output to a low state. This low voltage state is applied to the MOSFET gates through resistor R4 causing the MOSFETs to turn off (the output terminals or contacts to open) preventing any load current. The capacitor C2, and battery via resistor R3 along with the series diode D2 provide power to the inverter/driver. In this condition, the discharge current from the battery is again extremely small.

There are two transition conditions: from on-off and off-on when a larger current is drawn from the MOSFET gate's capacitance. Only during the MOSFET turn-on transition (off-on), and sometimes shortly after it, will energy be used from the battery to charge the discharge capacitor C2.

When an input signal is applied, the photovoltaic cell generates a voltage which is applied to the input of the inverter/driver U2A. Once that voltage crosses the threshold of the inverter/driver, its output goes down very rapidly. During this state, the charge stored in the MOSFET gates begins to discharge through resistor R4 into the inverter/driver. Most of this charge eventually ends up in the capacitor C2. There is no waste of energy from the battery in this case. Also, the voltage from the photovoltaic cell reaches a high enough level to start to also charge the capacitor C2 through the diode D1.

When the input signal is removed from the photovoltaic cell, its dropping output voltage crosses the threshold of the inverter/driver, and the output of the inverter/driver moves up rapidly. At this point, there is a very short power consuming transition cycle. The energy from the capacitor C2 is applied through the inverter/driver to the MOSFET gates. Charge immediately starts to flow into the gate capacitance causing capacitor C2 to start to discharge. Once the voltage on the capacitor C2 drops sufficiently, the battery BT1 begins providing energy to keep the inverter/driver low and in an attempt to charge C2 to its original level via the resistor R3 and the diode D2 as well as continuing to supply any remaining charge needed by the MOSFET gate.

When a rechargeable battery is used, it can recharge whenever there is an input signal on the photovoltaic device through the leakage or reverse current through diode D2. The optional resistor R2 can be used to set an optimum charging current into the battery BT1 and is only needed when the diode D2 has too small a reverse current to be effective. In any case, the capacitor C2 should be a low leakage type with a low internal inductance designed for high-speed discharging. If this condition is not met, the relay may not turn on fast enough.

The input resistor-capacitor R1/C1 network provides the optimum input current for the photovoltaic to generate the voltage for controlling the inverter/driver U2A and charging and discharging the capacitor C2 and Battery BT1. The additional resistor R6 limits the maximum current into the photovoltaic device.

The normally closed (SSR-NC) relay of the present invention can be housed in a similar footprint as a mechanical relay with single in-line pins leading to easy printed circuit board mounting or implementation with plug-in sockets. There are many other ways the devices of the present invention can be packaged. For example, the relay could be assembled on a circuit board having functional sub-blocks and discrete components connected by conductive traces to other systems. Any assembly, packing method or footprint is within the scope of the present invention.

Figure 3:
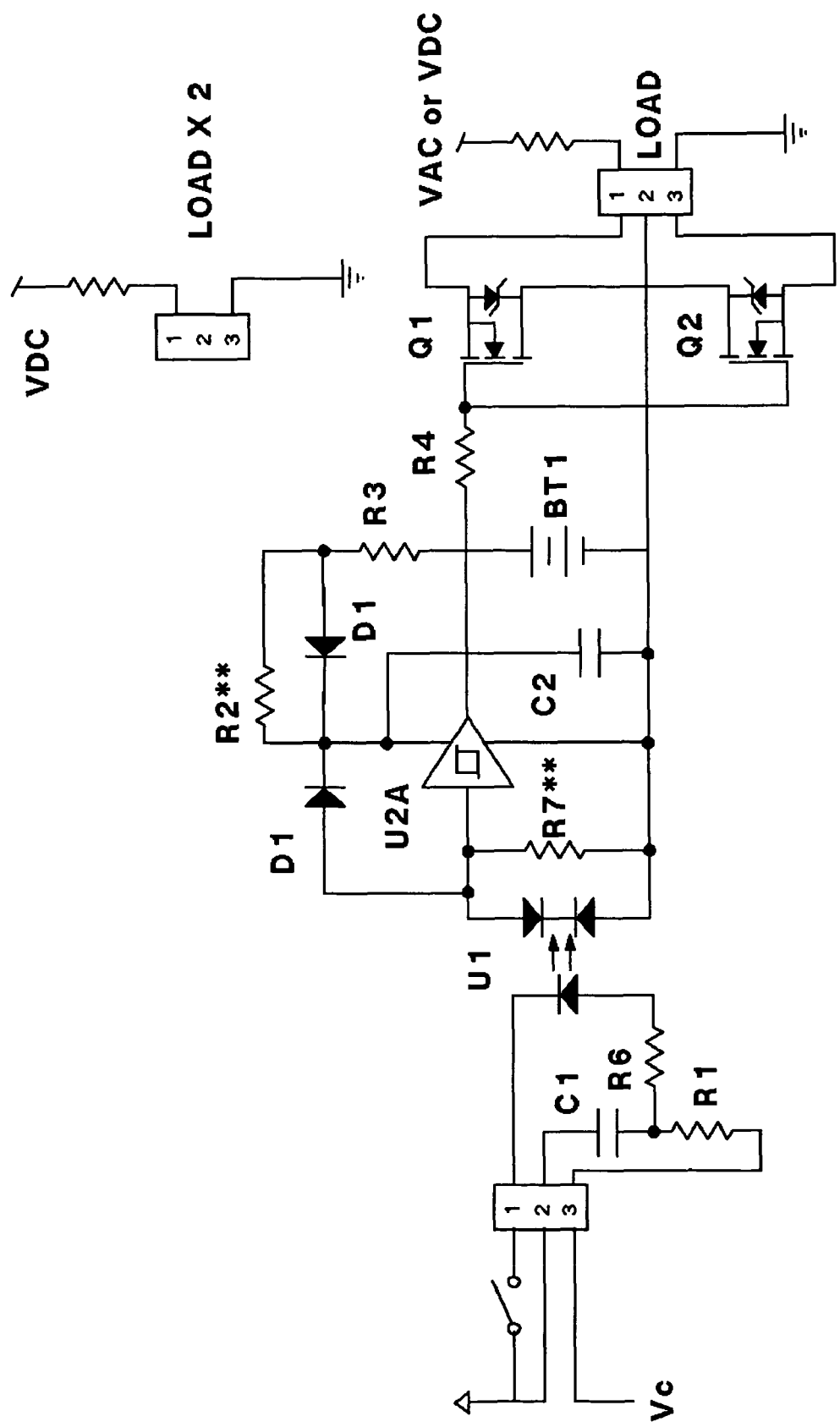
FIG. 3 shows the embodiment of FIG. 1 with input and outputs.

FIG. 2 shows the embodiment of FIG. 1 using a large capacitor rather than a battery. FIG. 3 shows the embodiment of FIG. 1 with an input switch which could be any electronic circuit and a choice of two different types of AC or DC load connection arrangements. The left load choice wires the load in series with the two transistors. This arrangement is best for AC loads. The second load choice uses the two transistors in parallel. In a DC application, this can provide for twice the current. Any type of input or load arrangement is within the scope of the present invention.

Several descriptions and illustrations have been provided to aid in understanding the present invention. One skilled in the art will realize that many changes and variations are possible without departing from the spirit of the invention. Each of these changes and variations is included in the scope of the present invention.

I claim:

1. A low power consumption, normally closed solid-state power relay comprising:
   at least one power transistor having a control lead connected to a load, said power transistor configured to carry current related to said load;
   a driver circuit with an input terminal driving said control lead of said power transistor to both an on state and an off state, said driver circuit having positive and negative power leads, said driver circuit holding said power transistor normally on;
   a photovoltaic cell electrically connected to the input terminal of said driver circuit, wherein when an input voltage is applied to said photovoltaic cell, said photovoltaic cell causes said driver circuit to switch turning off said power transistor;
   a capacitor electrically connected between said positive and negative power leads of said driver, wherein said capacitor supplies power to said driver circuit when said driver circuit switches;
   a diode connecting said photovoltaic cell to said capacitor, wherein when an input voltage is applied to said photovoltaic device, said photovoltaic device charges said capacitor.

2. The low power consumption, normally closed solid-state power relay of claim 1 further comprising a battery connected in parallel with said capacitor.

3. The low power consumption, normally closed solid-state power relay of claim 1 wherein a second diode connects said capacitor to said positive power lead, and said capacitor is charged by leakage current through said second diode.

4. The low power consumption, normally closed solid-state power relay of claim 1 wherein said power transistor is a MOSFET.

5. A normally-closed solid-state relay comprising:
   an input terminal containing an photovoltaic cell;
   a driver circuit electrically coupled to said photovoltaic cell, said driver circuit having a positive and negative power lead and a driving output lead;
   a power transistor electrically coupled to said driving output lead of said driver circuit;
   wherein said power transistor is held in an on state by said driver circuit when no voltage or a low level voltage is applied to said input terminal, and said power transistor is held in an off state by said driver circuit when a high level voltage is applied to said input terminal;
   a capacitor coupled between said positive and negative power lead of said driver circuit, said capacitor powering said driver circuit when said driver circuit switches; and
   wherein said photovoltaic cell charges said capacitor when a high level voltage is applied to said input terminal.

6. The normally closed solid-state relay of claim 5 wherein said capacitor is charged by leakage current through a diode.

7. The normally closed sold-state relay of claim 5 further comprising a battery connected in parallel with said capacitor.

8. The normally closed solid-state relay of claim 5 wherein said power transistor is a MOSFET.

* * * * *